(12) United States Patent
Thalheim

(10) Patent No.: US 11,683,030 B2
(45) Date of Patent: *Jun. 20, 2023

(54) PROTECTING SEMICONDUCTOR SWITCHES IN SWITCHED MODE POWER CONVERTERS

(71) Applicant: POWER INTEGRATIONS, INC., San Jose, CA (US)

(72) Inventor: Jan Thalheim, Biel (CH)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/747,818

(22) Filed: May 18, 2022

(65) Prior Publication Data

US 2022/0393676 A1    Dec. 8, 2022

Related U.S. Application Data

(63) Continuation of application No. 16/456,922, filed on Jun. 28, 2019, now Pat. No. 11,368,148.

(30) Foreign Application Priority Data

Jul. 12, 2018 (EP) .................................... 18183155

(51) Int. Cl.
  *H02H 7/00* (2006.01)
  *H03K 17/082* (2006.01)
  (Continued)

(52) U.S. Cl.
  CPC ....... *H03K 17/0822* (2013.01); *H02H 1/0007* (2013.01); *H03K 5/24* (2013.01)

(58) Field of Classification Search
  None
  See application file for complete search history.

(56) References Cited

U.S. PATENT DOCUMENTS 6,462,971 B1   10/2002  Balakrishnan et al.
6,525,514 B1   2/2003   Balakrishnan et al.
(Continued)

FOREIGN PATENT DOCUMENTS

EP        2501042 A1      9/2012

OTHER PUBLICATIONS

Communication Pursuant to Article 94(3) EPC dated Oct. 6, 2020 in European application 18183155.3, 10 pgs.
(Continued)

*Primary Examiner* — Stephen W Jackson
(74) *Attorney, Agent, or Firm* — Power Integrations, Inc.

(57) ABSTRACT

Driver circuitry for driving a power semiconductor switch having a control input and main terminals is described. The driver circuitry includes control terminal driver circuitry coupled to the control input and configured to provide a drive signal, a sense terminal coupled to the main terminal, a current mirror coupled to the sense terminal to mirror a current input into the sense terminal during turn-off, a first current comparator configured to compare a current signal received from the current mirror to a first current threshold and output a first signal representative of the comparison, and a second comparator configured to compare a signal received from the sense terminal to a turn-on threshold and output a second signal representative of the comparison. The turn-on threshold represents a highest voltage of the main terminal during turn-on. The first current threshold represents a highest voltage of the main terminal during turn-off.

14 Claims, 11 Drawing Sheets

(51) Int. Cl.
*H02H 1/00* (2006.01)
*H03K 5/24* (2006.01)

(56) References Cited

U.S. PATENT DOCUMENTS

| | | | | |
|---|---|---|---|---|
| 7,148,741 | B2* | 12/2006 | Berger | G05F 1/565 |
| | | | | 307/140 |
| 7,157,813 | B2 | 1/2007 | Djenguerian et al. | |
| 7,576,528 | B2 | 8/2009 | Wang et al. | |
| 8,077,483 | B2 | 12/2011 | Djenguerian et al. | |
| 8,598,921 | B2 | 12/2013 | Thalheim et al. | |
| 9,584,017 | B1 | 2/2017 | Sundaresan et al. | |
| 2007/0285133 | A1* | 12/2007 | Dickman | H02M 1/08 |
| | | | | 327/108 |
| 2010/0079197 | A1 | 4/2010 | Ladurner et al. | |
| 2012/0200320 | A1 | 8/2012 | Thalheim et al. | |
| 2016/0036430 | A1 | 2/2016 | Rannestad | |
| 2016/0373019 | A1 | 12/2016 | Hsu et al. | |
| 2017/0346274 | A1 | 11/2017 | Nakahara et al. | |
| 2018/0302000 | A1 | 10/2018 | Moon et al. | |
| 2022/0263412 | A1* | 8/2022 | Bertolini | H02M 3/1588 |

OTHER PUBLICATIONS

European Patent Application No. 18183155.3; "Communication pursuant to Article 94(3) EPC;" dated Dec. 22, 2021; 10 pages.
Extended European Search Report On European Patent Application No. EP 18183155.3, dated Feb. 4, 2019, 9 pages.
"Si9910 Adaptive Power MOSFET Driver", Nov. 15, 2004, 8 pages.

* cited by examiner

FIG. 4A with RC2 coupled to VEE:
$V_{SNS} \equiv V_{CE}RC2/(RC1 + RC2)+VEE$
FIG. 4A with RC2 coupled to COM:
$V_{SNS} \equiv (V_C-COM)RC2/(RC1 + RC2)+VEE$ $V_{SNS} \equiv V_{CE}(RS1+RS2)/(RS1+RS2+RC1)+VEE+RS1(I_{ESNS})$
with $I_{ESNS} = \alpha\ I_{CE}, \alpha < 10000$

PROTECTING SEMICONDUCTOR SWITCHES IN SWITCHED MODE POWER CONVERTERS

CROSS-REFERENCE TO RELATED APPLICATIONS

This application is a continuation of U.S. patent application Ser. No. 16/456,922 filed on Jun. 28, 2019, now U.S. Pat. No. 11,368,148, which claims the benefit of European Patent Application No. EP18183155, filed Jul. 12, 2018, hereby incorporated by reference in their entirety.

BACKGROUND INFORMATION

Field of the Disclosure

The present invention relates generally to protecting semiconductor switches in switched mode power converters.

Background

Electronic devices use power to operate. Switched mode power converters are generally used to convert an unregulated or loosely-regulated input into a more tightly regulated output by controlling the transfer of power across an energy transfer element. In addition to the energy transfer element, switched mode power converters generally include at least one power switch and a controller that controls the power switch. The controller switches the power switch to control the transfer of energy across the energy transfer element and achieve a regulated output. The controller generally receives a feedback signal representative of the output and, in a closed loop control scheme, varies one or more switching parameters to regulate the output to a desired quantity. In different implementations, a desired output can be achieved, e.g., by varying the switching duty cycle (the ratio of the on time of the switch to the total switching period), varying the switching frequency, and/or varying the number of on-time pulses per unit time of the power switch.

There are many circumstances that can lead to failure of a switched mode power converter. For example, in many applications, high voltages are applied across a power switch and high currents are conducted between its main terminals. If the power switch is not properly designed to withstand the high voltages or carry the high currents, the power switch could be damaged. Further, even a properly designed power switch can be damaged under improper operating conditions, including power cross, electrostatic discharge events, power surges, lightning strikes, and others. Depending on the operational context, failure of the power switch can lead not only to failure of the power converter, but also to failure of other equipment and the loss of property and even lives.

BRIEF DESCRIPTION OF THE FIGURES

Non-limiting and non-exhaustive embodiments of the present invention are described with reference to the following figures, wherein like reference numerals refer to like parts throughout the various views unless otherwise specified.

Figure 1:
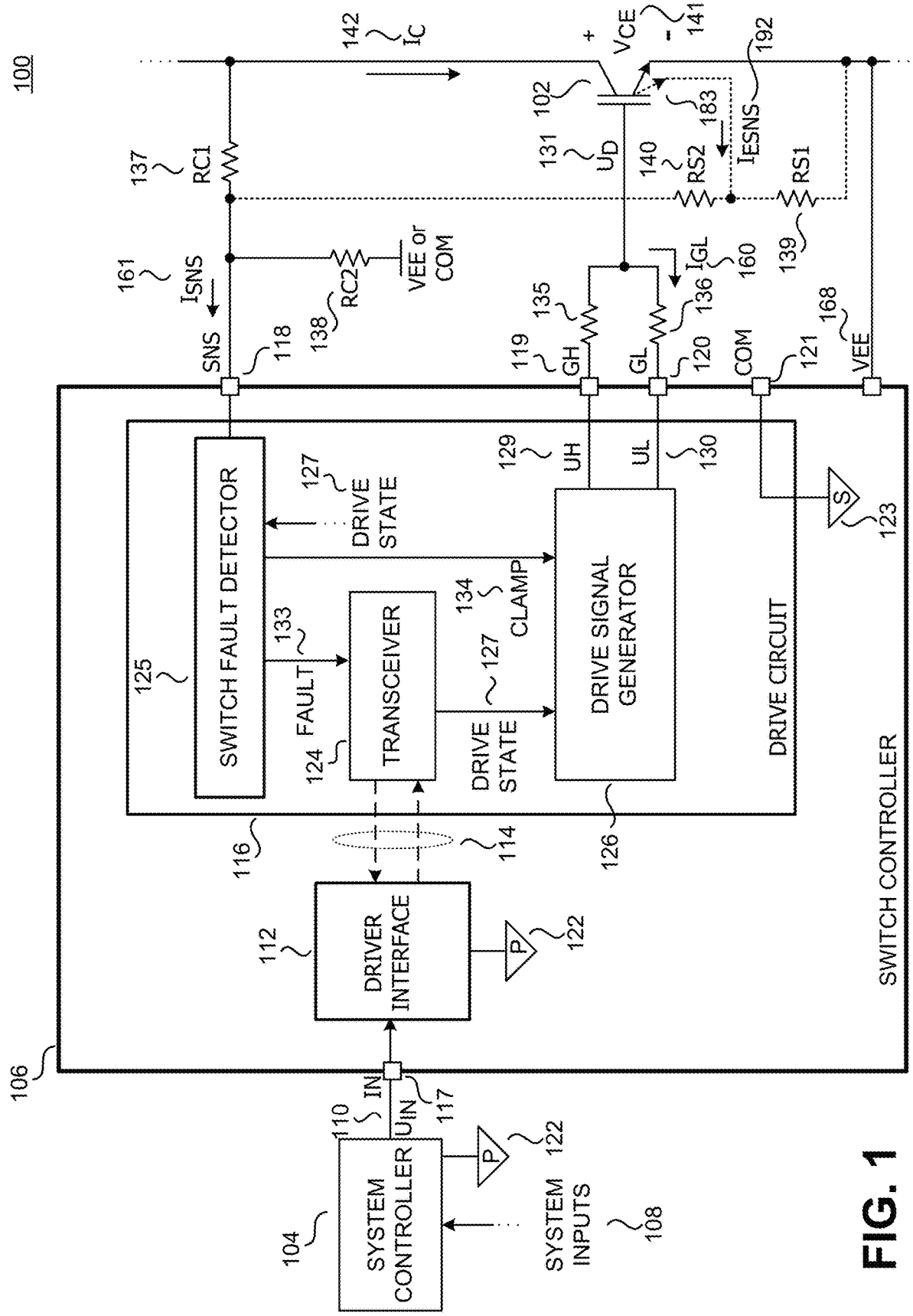
FIG. 1 illustrates an example switch control system including a switch controller with a switch fault detector, in accordance with an embodiment of the present disclosure.

Corresponding reference characters indicate corresponding components throughout the several views of the drawings. It should be appreciated that similarly named and numbered elements couple and function the same. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION OF THE FIGURES

Examples of a switch fault detector for a switch controller are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example," or "an example"

means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In a switched mode power converter, a controller can set a power switch into a more conductive ON (i.e., closed) state or an essentially non-conductive OFF (i.e., open) state. Controllers are generally used with protective circuitry to detect and/or prevent various conditions that could harm the power switch and the power converter. Overvoltage conditions and overcurrent conditions are examples.

Overvoltage conditions generally occur when the power switch is OFF or during turn-off (i.e., the transition from a ON state to an OFF state). Active clamping seeks to prevent overvoltages from arising across the power switch by active control of the power switch or circuitry associated with the power switch. For example, in some implementations, a drive signal input into the control terminal (e.g., the gate or base) of a power switch can be actively controlled to limit the voltage at a main terminal (e.g., the collector or the drain) during turn-off. In many implementations, it is common practice to use transient voltage suppressor (TVS) diodes that are connected between the collector/drain and the gate. There are also active clamping techniques that use capacitively-compensated resistor voltage dividers to provide a sensed power switch voltage to a gate driver. The divided voltage that acts as the sensed power switch voltage is compared to a voltage threshold by a comparator that controls the current/voltage provided to the control terminal of the power switch to reduce turn-off overvoltage of the power switch.

Overcurrent or short circuit conditions generally occur when the power switch is ON or during turn-on (i.e., the transition from OFF to ON). In some cases, the current that flows between the main terminals of the power switch is estimated by measuring the voltage across the main terminals of the power switch. Under normal operating conditions, the voltage across the main terminals of the power switch should fall quickly to a relatively low level during turn on and remain at the low level while the power switch is ON. However, under a short circuit or overcurrent condition, the voltage across the power switch may initially fall but then rise after some time. In other overcurrent conditions, the voltage across the power switch may fall during turn-on, but the rate of decrease may be lower than the rate of decrease under normal operating conditions. Overcurrent conditions may thermally load the power switch and damage the power switch even after a relatively short period of time.

As discussed above, controllers are generally used in conjunction with protective circuitry that detects and/or responds to or avoids overvoltage or overcurrent conditions and protects the power switch from harm. However, as the operational voltage of the power converter increases, it becomes more difficult to provide overvoltage and overcurrent protection. In particular, an overcurrent or short circuit is generally detected when the voltage across the main terminals of the power switch is low or even approaching zero. An overvoltage is necessarily detected when the voltage across the power switch is unduly high. By way of example, modern high-voltage IGBTs can withstand voltages of 3.3 kV or higher—and overvoltages in this context are higher still. Protection circuitry must thus be able to tolerate a very large range of operational parameters. As a result, the protection circuitry is often complex and the level of integration is low. Further, transient voltage suppressor (TVS) diodes are generally costly.

In one example, the switch controller includes a switch fault detector that both detects and responds to overcurrent or short circuit conditions and actively clamps the voltage across the power switch to prevent overvoltage conditions. In some implementations, the fault detector can receive—at a single sense terminal— signals representative of the current flowing through the power switch and the voltage across the main terminals of the power switch. When the power switch is OFF, the signal received at the sense terminal represents the voltage across the power switch and the switch fault detector prevents overvoltage conditions. When the power switch is ON, the signal received at the sense terminal represents the current flowing through the power switch and the switch fault detector detects overcurrent and/or short circuit conditions and responds accordingly.

For example, in some implementations, the signal representative of the voltage across the main terminals of the power switch is a current signal received at the sense terminal. The sense current signal representative of the voltage across the power switch is compared to a variable current reference. When the sense current signal is greater than the current reference, the switch fault detector outputs a clamp signal to control the control current of the power switch. As such, the switch controller provides active clamping for overvoltage conditions.

As another example, in some implementations, the signal representative of the current through the switch is a voltage signal received at the sense terminal. This voltage signal is compared to a voltage reference. When the sense voltage signal is greater than the voltage reference, the switch fault detector outputs a fault signal to turn the power switch OFF. As such, the switch controller provides overcurrent and/or short-circuit protection.

FIG. 1 illustrates an example switch control system 100 that includes a switch controller 106 and a power switch 102. Switch controller 106 includes a switch fault detector 125. Switch control system 100 can be part of a power converter that receives an input voltage and transfers electrical energy from the input to a load through an energy transfer element by controlling the switching of power switch 102.

In the illustrated example, power switch 102 is an insulated-gate bipolar transistor (IGBT). Other power switches can be used in other embodiments. For example, metal-oxide-semiconductor field-effect transistors (MOSFETs), bipolar transistor, injection enhancement gate transistors (IEGTs) and gate turn-off thyristors (GTOs) can be used. Further, the switch control system 100 can be used with power switches that are based on silicon (Si), gallium nitride (GaN) semiconductor or silicon carbide (SiC) semiconductors.

System controller 104 is a device that is coupled to receive system inputs 108 and to provide an input signal $U_{IN}$ 110 to switch controller 106. Input signal $U_{IN}$ 110 is received at the input terminal IN 117 of switch controller 106. At times, input signal $U_{IN}$ 110 may be a command signal instructing switch controller 106 to turn ON or to turn OFF power switch 102. For example, input signal $U_{IN}$ 110 can be a rectangular pulse waveform in which logic high and logic low sections have different durations. The logic high sections may indicate, e.g., that power switch 102 is to be ON whereas logic low sections may indicate that power switch 102 is to be OFF.

Switch controller 106 controls power switch 102 and includes a driver interface 112 and a drive circuit 116. In some cases, driver interface 112 and system controller 104 are both referenced to a primary reference potential 122 whereas drive circuit 116 is referenced to a secondary reference potential 123. Driver interface 112 and drive circuit 114 are coupled to communicate through a communication link 114. Communication link 114 galvanically isolates driver interface 112 and drive circuit 116. In the illustrated implementation, communication link 114 is bidirectional. In other implementations, communication between the driver interface 112 and the drive circuit 114 may be unidirectional. In some implementations, communication link 114 is implemented using, e.g., a signal transformer, a coupled inductor, or other inductive coupling.

In operation, driver interface 112 interprets input signal $U_{IN}$ 110 received from the system controller 104. Based on the interpretation, driver interface 112 sends a command signal to drive circuit 116 via communication link 114. The command signal can, e.g., instruct drive circuit 116 to drive power switch 102 ON or OFF. Drive circuit 116 generates a drive signal $U_D$ 131 to control the switching of power switch 102. The illustrated implementation of drive circuit 116 includes a transceiver 124, a switch fault detector 125, and a drive signal generator 126. Transceiver 124 receives and interprets the communications from driver interface 112 and provides a drive state signal 127 to switch fault detector 125 and drive signal generator 126. Drive state signal 127 commands drive signal generator 126 to control power switch 102 ON or OFF. For example, drive state signal 127 can be a rectangular pulse waveform with logic high and logic low sections of varying duration. In this example, power switch 102 is to be turned ON by drive signal generator 126 when drive state signal 127 is logic high and turned OFF when drive state signal 127 is logic low. In the illustrated example, drive state signal 127 is a single signal on a single channel. In other examples, drive state signal 127 can be communicated as multiple signals and/or on multiple channels. For example, one signal on one channel can instruct drive signal generator 126 to turn power switch 102 ON and another signal on another channel can instruct drive signal generator 126 to turn power switch 102 OFF.

As will be further discussed, transceiver 124 is coupled to receive a fault signal 133 indicating a overcurrent or short circuit from the switch fault detector 125. Transceiver 124 relays a notification of the fault to driver interface 112 via communication link 114.

Drive signal generator 126 is coupled to receive drive state signal 127 and output a gate high signal UH 129 and a gate low signal UL 130 to control switching of power switch 102. Gate high signal UH 129 is output from a gate high terminal GH 119 of switch controller 106 to turn power switch 102 ON. Gate low signal UL 130 is output from a gate low terminal GL 120 of switch controller 106 to turn power switch 102 OFF. Gate high signal UH 129 and gate low signal UL 130 may be voltage signals or current signals. A drive signal UD 131 is a combination of gate high signal UH 129 and gate low signal UL 130. Resistances 135 and 136 are coupled to the gate high GH terminal 119 and gate low terminal GL 120, respectively. A turn off current $I_{GL}$ 160 is shown as the current into the gate low terminal GL 120. In other words, the turn off current IGL 160 is the gate current of the power switch 120 when the power switch 102 is OFF.

The illustrated implementation of switch controller 106 also includes a return terminal COM 121 and an emitter terminal VEE 168. Return terminal COM 121 is coupled to secondary return 123 and provides a return reference for the circuitry coupled to the secondary side of switch controller 106. Emitter terminal VEE 168 is coupled to the emitter/source of power switch 102. In the illustrated implementation, power switch 102 is an IGBT and it includes collector, emitter, and gate terminals. However, other power switches may include drain, source, and gate terminals or collector, emitter and base terminals.

Switch fault detector 125 is coupled to receive drive state signal 127 and a sense signal from sense terminal SNS 118 of switch controller 106. The sense signal may be a voltage signal (i.e., voltage VSNS at the sense terminal SNS 118 or current signal (i.e., the sense current $I_{SNS}$ 161. Switch fault detector 125 outputs fault signal 133 and a clamp signal 134 based on the sense signal at sense terminal SNS 118 and drive state 127. As discussed in further detail below, the impedance of the sense terminal SNS 118 is high when switch fault detector 125 is monitoring for overcurrent or short circuit, i.e., when power switch 102 is in an ON state or turning on. In contrast, the impedance of the sense terminal SNS 118 is low when switch fault detector 125 participates in active clamping of power switch 102, i.e., when power switch 102 is in an OFF state or turning off. For example, in some implementations, the input impedance of sense terminal SNS 118 is less than 200 kOhms (e.g., less than 10 kOhms) when power switch 102 is in an OFF state or turning off, whereas the input impedance of sense terminal SNS 118 is greater than 10 MOhms (e.g., greater than 100 MOhms) when power switch 102 is in an ON state or turning on. Switch control system 100 also includes a resistance RC1 137 that is coupled between sense terminal SNS 118 and the collector/drain of power switch 102. In operation, voltage VCE 141 across the power switch 102 drives a current through resistance RC1 137. At least a portion of the current through resistance RC1 137 flows into sense terminal SNS 118 as sense current $I_{SNS}$ 161. Switch control system 100 also includes a resistance RC2 138. One end of resistance RC2 138 is coupled between sense terminal SNS 118 and resistance RC1 137. The other end is coupled to either return terminal COM 121 or the emitter terminal VEE 168. Together, resistances RC1 137 and RC2 138 form a voltage divider and convert the voltage across power switch 102 into a sense signal.

Optionally, power switch 102 may include a sense terminal 183 (shown in dashed lines). Sense terminal 183 outputs a current $I_{ESNS}$ 192 that is a small percentage of the total switch current IC 142. When power switch 102 includes sense terminal 183, resistances RS1 139 and RS2 140 may be coupled to sense terminal 183. The voltage across resistance RS1 139 is proportional to the total switch current IC 142. Resistance RS2 is used to couple the voltage across RS1 to the sense terminal SNS 118. In the illustrated implementation, resistance RS1 139 is coupled to the sense terminal 183 and the emitter/source of power switch 102. Resistance RS2 140 is coupled to sense terminal 183 of power switch 102, between resistance RC1 137 and sense terminal SNS 118 of switch controller 106. During overcurrent and/or short circuit detection, the input impedance of sense terminal SNS 118 is high, and the voltage at the SNS terminal 118 is representative of the switch current IC 142. Further, sense voltage VSNS at sense terminal 183 represents both current $I_{ESNS}$ 192 and switch current $I_C$ 142. In implementations where sense terminal 183 and resistances RS1 129 and RS2 140 are used, resistance RC2 138 is optional.

In operation, switch fault detector 125 monitors the voltage or the current at the sense terminal SNS 118 to determine if an overvoltage, overcurrent, or short circuit condition is occurring.

Overvoltage Prevention

At times when drive state signal 127 indicates that power switch 102 should be OFF, switch fault detector 125 is coupled to sense overvoltage conditions using current ISNS 161 that flows into sense terminal SNS 118. The input impedance of sense terminal SNS 118 is low. Resistance RC1 137 converts voltage VCE 141 across the power switch 102 into a current, shown as sense current ISNS. If an overvoltage condition is detected, switch fault detector 125 uses clamp signal 134 to reduce the turn off speed of power switch 102 which clamps the voltage of power switch 102. In response to an indication in clamp signal 134, drive signal generator 126 uses gate low signal UL 130 to reduce voltage VCE 141 across the power switch 102.

The value of resistance RC1 137 is chosen to select the level of voltage VCE 141 across power switch 102 that triggers clamp signal 134 (i.e., adjusts the clamping level of the switch voltage VCE 141). In particular, switch fault detector 125 can be provided with a fixed preset threshold level and resistance RC1 137 can specify the voltage of voltage VCE 141 that exceeds this fixed threshold. Thus, switch fault detector 125 can be used in different operating conditions and/or in conjunction with different power switches 102.

As discussed previously, the input impedance of switch controller 106 at sense terminal SNS 118 is low when switch fault detector 125 is monitoring for overvoltage. In other words, the impedance of the sense terminal SNS 118 is low when the drive state 127 indicates that the power switch 102 should be OFF. The resistance for resistance RC2 138 can be selected such that the impedance of resistance RC2 138 is much greater than the input impedance of switch controller 106 at sense terminal SNS 118. For example, the input impedance of switch controller 106 may be approximately 4-5 kOhms and the impedance of resistance RC2 138 is approximately 22-82 kOhms. In one example, resistance RC1 may be approximately 1-2 MOhms.

Overcurrent or Short Circuit Protection

When drive state signal 127 indicates that power switch 102 should be ON, switch fault detector 125 is coupled to sense overcurrent and/or short circuit conditions based on the voltage at the sense terminal SNS 118. The impedance of the sense terminal SNS 118 is high and voltage VSNS represents the switch current IC 142 when power switch 102 is ON or turning on. In implementations where power switch 102 includes a sense terminal 183, current IESNS 192 shifts the potential between resistances RCS1 139 and RS2 140 to a corresponding level and changes the voltage SNS at sense terminal SNS 118. Once again, current IESNS 192 is a percentage of switch current IC 142. In implementations where power switch 102 does not include sense terminal 183, the relatively low switch voltage VCE 141 drives a current through resistance RC1 137. The current through resistance RC1 137 also encounters the impedance provided by the input impedance of switch controller 106 and resistance RC2 138, providing a voltage SNS representative of switch current IC 142 at sense terminal SNS 118. In the ON state, switch voltage VCE 141 is related to the product of the ON state impedance of power switch 102 and switch current IC 142.

If an overcurrent or short circuit is detected, switch fault detector 125 outputs fault signal 133 to transceiver 124. In response to fault signal 133, transceiver 124 changes drive state signal 127 to command drive signal generator 126 to turn OFF the power switch 102. In response, drive signal generator 126 turns OFF power switch 102. Transceiver 124 may also outputs fault signal 133 to driver interface 112. The driver interface 112 relays an indication of the fault to system controller 104.

The impedances of resistances RC1 137 and RC2 138 (or optionally, RS1 139 and RS2 140) can be selected partially based on an internal voltage reference V1 of switch fault detector 125 and the desired desaturation level of power switch 102. The high input impedance of the sense terminal SNS 118 is in parallel with resistances RC2 138 (or in parallel with resistances RS1 139 and RS2 140). When resistances RC1 137 and RC2 138 are used to provide the sense voltage SNS, the value of resistance RC2 138 adjusts the desaturation level relative to the internal reference voltage V1 of the switch fault detector 125. An example is further discussed with respect to FIG. 4A. The greater the value of resistance RC2 138, the lower the desaturation level of the power switch 102. In other words, the greater the value of resistance RC2 138, the lower the switch current IC 142 that triggers the fault signal 133. Similarly, when resistances RS1 139 and RS2 140 provide sense voltage SNS, resistance RS2 140 adjusts the desaturation level for the power switch 102 with respect to the internal reference voltage V1 of switch fault detector 125 and resistance RS1 139 converts the current IESNS 192 into a voltage within the voltage range for the Safe Operation Area (SOA) standard for the respective power switch 102. An example is further discussed with respect to FIG. 4B.

Monitoring for both overcurrent and overvoltage at the same sense terminal SNS 118 is quite a difficult challenge. For overcurrent detection, the sense voltage VSNS representative of the switch current IC 142 may be in the range of 0.2V-0.5V during turn ON and ON state of the power switch 102. However for overvoltage detection, the threshold to trigger overvoltage could be in the order of thousands of volts during turn OFF and OFF state of the power switch 102, for example: 1050 V. As such, the sense terminal 118 is subject to a wide voltage range. By sensing the switch voltage VCE 141 as a current signal ISNS 161 during turn OFF and OFF state may increase the speed of the control scheme.

Figures 2A, 2B:
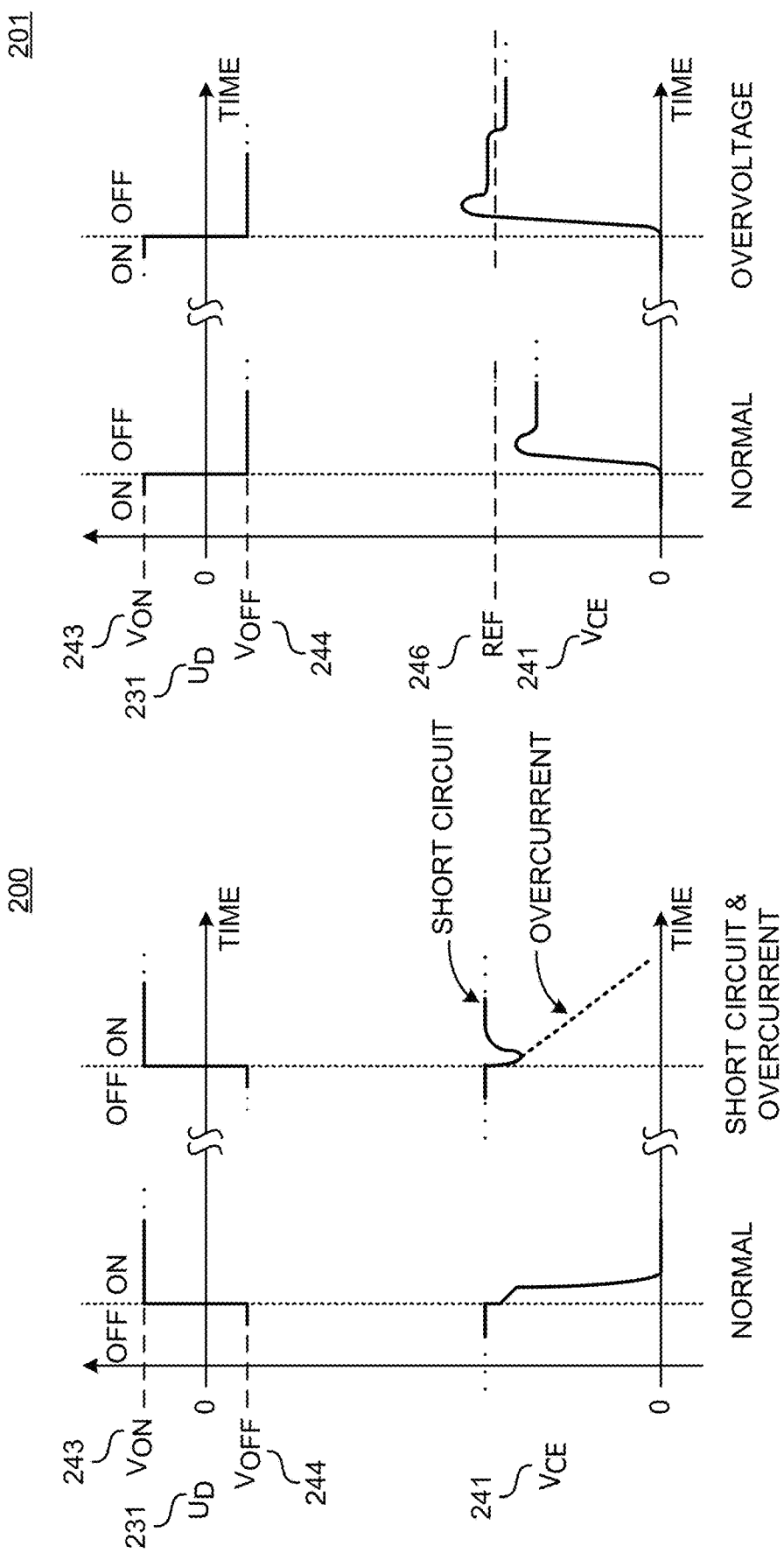
FIG. 2A illustrates example waveforms for a drive signal and switch voltage under normal conditions and a short circuit or overcurrent condition, in accordance with an embodiment of the present disclosure.
FIG. 2B illustrates example waveforms for a drive signal and switch voltage under normal conditions and an overvoltage condition, in accordance with an embodiment of the present disclosure.

FIG. 2A illustrates a timing diagram 200 with example waveforms for the drive signal 231 and the switch voltage VCE 241 under normal, short circuit, and overcurrent conditions during an OFF to ON transition of the power switch.

The upper waveform illustrates an example drive signal UD 231 that controls turn on and turn off of the power switch. During the OFF time, the drive signal UD 231 is substantially equal to the off voltage VOFF 244. During the ON time, the drive signal UD 231 is substantially equal to the on voltage VON 243.

The switch voltage VCE 241 (i.e., the voltage across the power switch) is shown in the lower portion of timing diagram 200. The lower left portion illustrates an exemplary switch voltage VCE 241 under normal conditions whereas the lower right portion illustrates an exemplary switch voltage VCE 241 under short circuit and overcurrent conditions. As shown in the lower left portion of timing diagram 200, the switch voltage VCE 241 quickly falls substantially zero after the power switch transitions from OFF to ON. In contrast, under short circuit conditions, the switch voltage VCE 241 may initially decrease but then rises again after some time. In one example, the switch voltage VCE 241 may decrease to its value during normal conditions but then increase. Under overcurrent conditions, the switch voltage VCE 241 may decrease—albeit at a much slower rate than normal conditions.

FIG. 2B illustrates timing diagram 201 with example waveforms for the drive signal 231 and the switch voltage VCE 241 under normal and overvoltage conditions during an ON to OFF transition of the power switch. The upper waveform illustrates an example drive signal UD 231 that controls turn on and turn off of the power switch. During the ON time, drive signal UD 231 is substantially equal to the on voltage VON 243. During the OFF time, drive signal UD 231 is substantially equal to the off voltage VOFF 244.

The switch voltage VCE 241 (i.e., the voltage across the power switch) is shown in the lower portion of timing diagram 200. The lower left portion illustrates an exemplary switch voltage VCE 241 under normal conditions whereas the lower right portion illustrates an exemplary switch voltage VCE 241 under overvoltage conditions. As shown in the lower left portion of timing diagram 201, during the ON to OFF transition, the switch voltage VCE 241 increases from nearly zero volts but remains less than a reference level 246. In this example, a switch voltage VCE 241 greater than reference level 246 indicates an overvoltage condition. As shown in the lower right portion of timing diagram 201, under overvoltage conditions, the switch voltage VCE 241 increases from zero volts to a level that is greater than reference level 246, indicating an overvoltage condition.

Figure 3A:
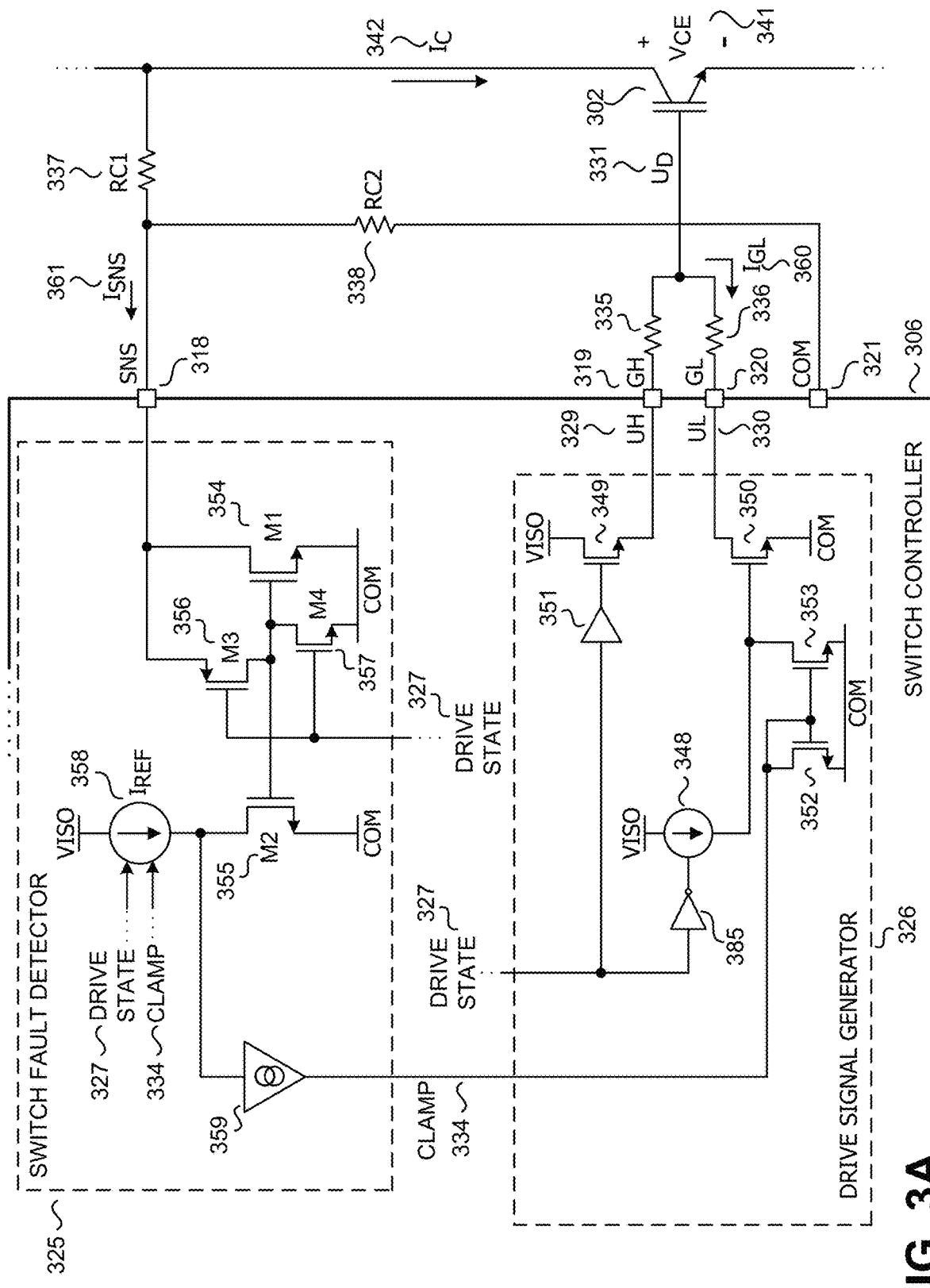
FIG. 3A illustrates an example switch fault detector for detecting overvoltage conditions of the switch controller of FIG. 1, in accordance with an embodiment of the present disclosure.

FIG. 3A illustrates an example of circuitry within switch fault detector 325 for detecting overvoltage conditions, as well as an example of couplings between such circuitry and drive signal generator 326. Please note that in addition to circuitry for detecting overvoltage conditions, switch fault detector 325 also includes circuitry for detecting and protecting against overcurrent and short circuit conditions. For didactic purposes, such circuitry is not shown in FIG. 3A. However, the circuitry for detecting overvoltage conditions in FIG. 3A can be combined with circuitry for detecting overcurrent and short circuit conditions as shown, e.g., in FIG. 4A.

The circuitry within switch controller 306 includes a drive signal generator 326 and switch fault detector 325. Drive signal generator 326 includes an on switch 349 and an off switch 350. Both on switch 349 and off switch 350 are illustrated as n-type transistors. One end of on switch 349 is coupled to a source voltage VISO while the other end is coupled to the gate high terminal GH 319. On switch 349 is controlled by drive state signal 327 via the driver 351. In operation, when drive state signal 327 indicates that power switch 302 is to be turned ON (e.g., drive state signal 327 is logic high), driver 351 controls on switch 349 into conduction and provides gate high signal UH 329 to gate high terminal GH 319 and resistance 335. At the same time, off switch 350 is controlled off and drive signal 331 is substantially equal to the gate high signal UH 329. Power switch 302 turns ON in response.

Off switch 350 is coupled to gate low terminal GL 320 and return COM and is controlled by drive state signal 327 via an inverter 385 and current source 348. Inverter 385 receives drive state signal 327 and controls current source 348 based thereon. As shown, current source 348 is coupled to the control terminal of off switch 350. In operation, when the drive state signal 327 indicates that power switch 302 is to be turned OFF (e.g., drive state signal 327 is logic low), inverter 385 controls current source 348 to provide current to turn on the off switch 350. Off switch 350 provides gate low signal UL 330 to the gate low terminal 320 and resistance 336. On switch 349 is controlled off. Drive signal $U_D$ 331 is substantially equal to the gate low signal UL 330. Power switch 302 turns OFF in response. As an aside, the current into the gate low terminal 320 may be referred to as the gate low current IGL 360.

Drive signal generator 326 further includes transistors 352 and 353 coupled together as a current mirror. The drain of transistor 352 is coupled to receive clamp signal 334 from switch fault detector 325. The drain of transistor 353 is coupled to the control terminal (e.g., gate) of off switch 350. As will be further discussed, transistors 352 and 353 mirror clamp signal 334 and pull current from the control (e.g., gate) terminal of off switch 350. With less current being input into the control terminal of off switch 350, gate current IGL 360 is reduced. This in turn reduces the rate at which power switch 302 turns off and the rate of change of switch voltage VCE 341.

The illustrated switch fault detector 325 senses overvoltage conditions and, when an overvoltage condition is detected, switch fault detector 325 and drive signal generator 326 actively clamp the switch voltage VCE 341. In further detail, switch fault detector 325 receives the sense signal at the sense terminal SNS 318. For overvoltage detection, the switch voltage VCE 341 is converted into a current signal, shown as sense current ISNS 361. Resistance RC1 337 is coupled to sense terminal SNS 318 and the collector/drain of the power switch 302 and converts switch voltage VCE 241.

Switch fault detector 325 includes current source 358, transistors M1 354, M2 355, M3 356, and M4 357, and current driver 359. Current source 358 is a variable current source and is coupled to receive drive state signal 327 and the clamp signal 334. Current source 358 also varies the magnitude of current $I_{REF}$ in response to drive state signal 327 and clamp signal 334. Details regarding the variation of current $I_{REF}$ by current source 358 are provided during the discussion of FIG. 3B.

Transistors M1 354, M2 355, M3 356, and M4 357 are coupled together to form a current mirror that can be switched on or off depending on the state of drive state signal 327. In particular, transistors M1 354, M2 355, and M4 357 are n-type transistors whereas transistor M3 356 is a p-type transistor. The gates of transistors M1 354 and M2 355, and the drains of transistors M3 356 and M4 357 are coupled together. The drain of transistor M1 354 and the source of transistor M3 356 are coupled to the sense terminal SNS 318 while the drain of transistor M2 355 is coupled to the current source 358 and the current driver 359. Further, the sources of transistors M1 354, M2 355, and M4 357 are coupled to the return COM. The gates of transistor M3 356 and M4 357 are coupled together and coupled to receive the drive state signal 327.

Current driver 359 is a current buffer and/or amplifier that is coupled to output a version of the difference between current IREF and the mirrored sense current that passes through transistor M2 355. In operation, switch fault detector 325 receives drive state signal 327 at the gates of transistors M3 356 and M4 357. The drive state 327 determines whether the switch fault detector 325 is to detect an overvoltage or an overcurrent/short circuit condition. In particular, when drive state signal 327 is logic low—indicating that power switch 302 is to be OFF or turning off—transistor M3 356 is ON and transistor M4 357 is OFF. A low-input impedance current mirror is formed by transistors M1 354, M2 355, M3 356. This low-input impedance current mirror is "seen" from sense terminal SNS 318. The current that flows through sense terminal SNS 318 and the current mirror is used in active clamping operations. In contrast, when drive state signal 327 is logic how—indicating that power switch 302 is to be ON or turning on— transistor M3 356 is OFF and transistor M4 357 is ON. Transistors M1 354, M2 355, M3 356 do not form a current mirror and a high input impedance is "seen" from sense terminal SNS 318. Other circuitry—such as shown, e.g., in FIGS. 4A, 4B, 4D— detects and protects against overcurrent and short circuit conditions.

In the illustrated implementation, when the drive state signal 327 indicates that power switch 302 should be OFF or turning off, the switch fault detector 325 is coupled to sense overvoltage conditions using the current ISNS 361 that enters sense terminal SNS 318. Transistors M1 354, M2 355, M3 356 mirror the received sense current ISNS 361. The mirrored sense current (i.e., the current that flows through transistor M2 355) is subtracted from the reference current IREF output by current source 358. Current driver 359 buffers and/or amplifies the difference and outputs clamp signal 334 based on the difference between the mirrored sense current and reference current $I_{REF}$. Clamp signal 334 is thus a variable current signal. In general, if the mirrored sense current is less than the reference current $I_{REF}$, then clamp signal 334 is substantially zero. Drive signal generator 326 receives clamp signal 334. Transistors 352 and 353 mirror clamp signal 334 and control how much current off switch 350 conducts. As shown, off switch 350 varies the gate low current IGL 360 such that the rate of change in switch voltage VCE 141 is reduced, effectively clamping switch voltage VCE 141. The off switch 350 initially operates in linear mode during the turn off transition. Off switch 350 enters saturation mode once to clamp the switch voltage VCE 341.

Further, the values of resistances RC1 337, RC2 338 may be chosen to adjust the value of the switch voltage VCE 341 that triggers the switch fault detector 325 assert clamp signal 334. The larger the value of resistance RC1 337, the higher the level of switch voltage VCE 341 that triggers active clamping. In other words, the higher the value for resistance RC1 337, the higher that the voltage VCE 341 that triggers switch fault detector 325 to assert the clamp signal 334.

Please note that when power switch 302 should be OFF or turning off and overvoltage conditions are to be sensed, the input impedance of sense terminal SNS 318 is low. Transistors M1 354, M2 355, M3 356 form a low impedance pathway to the return COM. The value of resistance RC2 338 can be selected such that the impedance of resistance RC2 338 is much greater than the input impedance of the sense terminal SNS 318 during overvoltage detection. For example, the input impedance of sense terminal SNS 318 during overvoltage detection may be approximately 4-5 kOhms and the impedance of resistance RC2 338 is approximately 22-82 kOhms. In one example, resistance RC1 337 may be approximately 1-2 MOhms. Such a relationship ensures that nearly all of the current that flows through resistance RC1 337 also flows into sense terminal SNS 318.

As an aside, in the illustrated example, resistance RC2 338 is coupled to the return terminal COM 321. Alternatively, resistance RC2 338 could be coupled to the emitter terminal, e.g., as shown in FIG. 1.

Figure 3B:
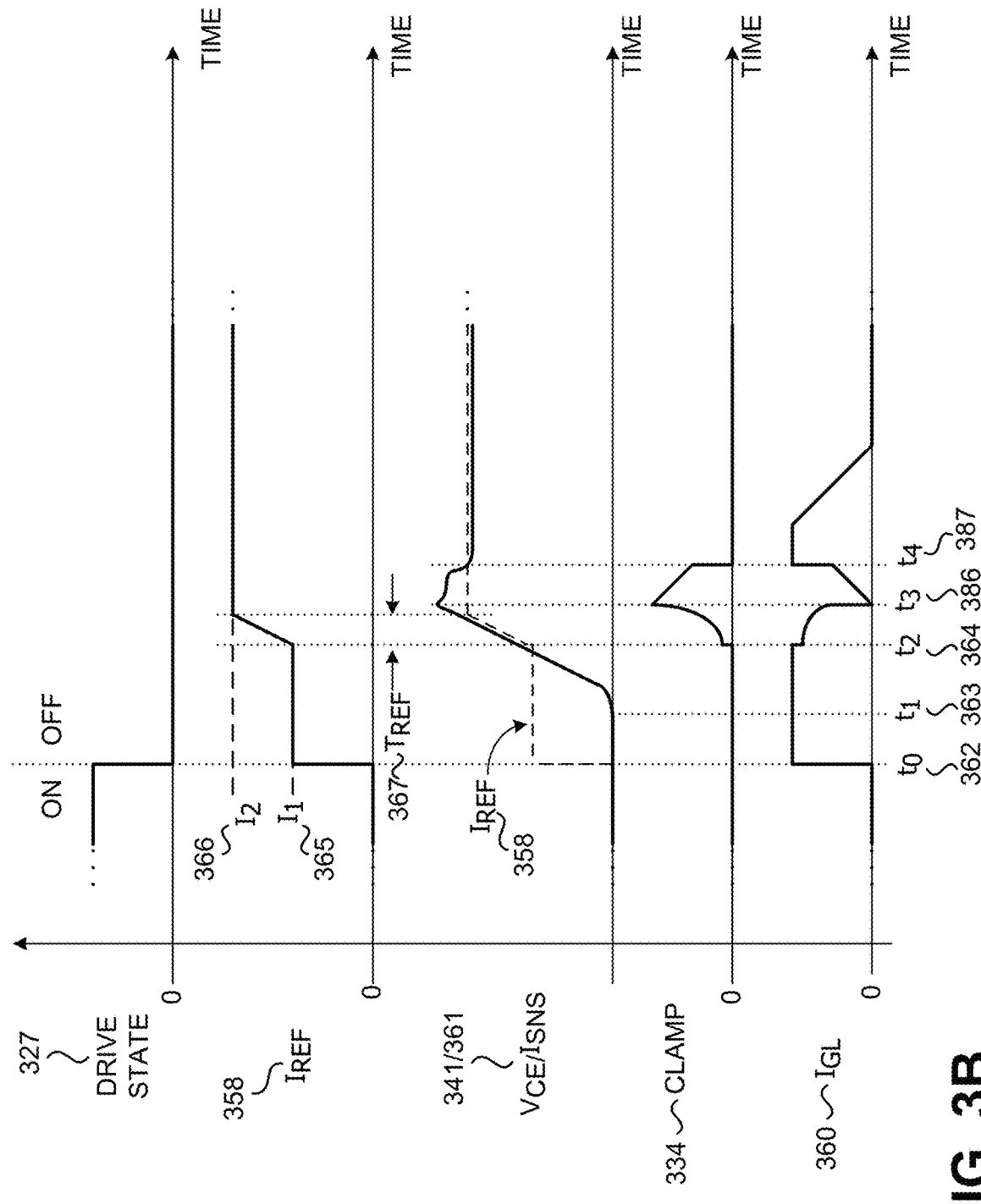
FIG. 3B illustrates a timing diagram of example waveforms of the various signals of FIG. 3A, in accordance with an embodiment of the present disclosure.

FIG. 3B illustrates timing diagram 301 that illustrates various waveforms that can arise when power switch 302 is turning off and should be OFF. In particular, waveforms for drive state signal 327, reference current signal $I_{REF}$ 358, sense current $I_{SNS}$ 361, clamp signal 334, and gate low current IGL 360 are shown. Drive state signal 327 is a rectangular pulse waveform with logic high and logic low sections of varying durations. In the illustrated example, logic high indicates that the power switch should be ON and logic low indicates that the power switch should be OFF.

At time $t_0$ 362, drive state signal 327 transitions to a logic low value. In response, switch fault detector 325 is coupled to detect overvoltage conditions and receives a sense current ISNS 361 representative of switch voltage VCE 341. In response to drive state signal 327, current source 358 increases reference current $I_{REF}$ to a first threshold $I_1$ 365. Further, drive signal generator 326 drives off switch 350 into conduction so that gate low signal UL 330 turns OFF power switch 302. As shown, gate low current $I_{GL}$ 360 increases to a value to turn off power switch 302. Between time $t_0$ 362 and $t_1$ 363, sense current $I_{SNS}$ 361—and the switch voltage $V_{CE}$ 341 that it represents—is still relatively low and remains below reference current $I_{REF}$ 358. As such, clamp signal 334 is substantially zero and the gate low current IGL 360 is substantially a constant, non-zero value.

At time $t_1$ 363, the sense current $I_{SNS}$ 361 begins to rise, indicating that the switch voltage VCE 341 is also rising as power switch 302 turns OFF. However, sense current $I_{SNS}$ 361 remains less than reference current $I_{REF}$ 358. As such, clamp signal 334 remains substantially equal to zero and gate low current $I_{GL}$ 360 is a substantially constant non-zero value.

However, at time $t_2$ 364, sense current ISNS 361 reaches reference current IREF 358. This indicates that power switch 302 is in an overvoltage condition. Clamp signal 334 begins to increase and gate low current IGL 360 decreases. In the illustrated waveforms, gate low current IGL 360 is an inverted version of clamp signal 334. As the clamp signal 334 increases, the gate low current IGL 360 decreases. The magnitude of the decrease in the gate low current IGL 360 is proportional (but generally not equal) to magnitude of the increase of the clamp signal 334. At time $t_2$ 364, the increase in clamp signal 334 triggers current source 358 to increase reference current $I_{REF}$ 358 from the first threshold I1 365 to the second threshold I2 366. The reference current $I_{REF}$ 358 reaches the second threshold I2 366 within a reference period $T_{REF}$ 367. In one example, the first threshold I1 365 of reference current IREF 358 may have a lower value to avoid control overshoot. In one example, the reference current IREF 358 may vary between 200 uA to 800 uA. The value for the reference current IREF 358 may be selected to be high enough such that control scheme responds at sufficient speed but low enough to avoid high power dissipation.

Between times $t_2$ 364 and $t_4$ 387, switch fault detector 325 and drive signal generator 326 are actively controlling off switch 350 to clamp the switch voltage VCE 341 (as shown by the sense current $I_{SNS}$ 361. In particular, between times $t_2$ 364 and $t_3$ 386, sense current $I_{SNS}$ 361 is greater than the reference current $I_{REF}$ 358, clamp signal 334 is increasing, and gate low current IGL 360 is decreasing. At time $t_3$ 386, the sense current ISNS 361 reaches its peak value. Clamp signal 334 also reaches its peak value and the gate low current IGL 360 has reached its lowest value. In the illustrated implementation, the lowest value of gate low current $I_{GL}$ 360 is shown as zero. This is coincidence and generally not the case. The switch fault detector 325 and drive signal generator 326 need the time between times $t_2$ 364 and $t_3$ 38 to bring switch voltage VCE 341 under control. The active clamping that occurs allows the switch controller 306 to slowly decrease the switch voltage VCE 341. Between time $t_3$ 386 and time $t_4$ 387, sense current $I_{SNS}$ 361 decreases but remains greater than the reference current $I_{REF}$ 358. Clamp signal 334 is still non-zero but decreases from its peak value. Gate low current $I_{GL}$ 360 increases from its valley value.

At time $t_4$ 387, sense current ISNS 361 has fallen below the reference current $I_{REF}$ 358 and remains so during the entire time that power switch 302 is OFF for the example shown. Clamp signal 334 falls to zero and gate low current IGL 360 returns to the constant non-zero value. After time $t_4$ 387, the gate voltage decreases to zero and the gate low current IGL 360 falls to zero.

Figure 3C:
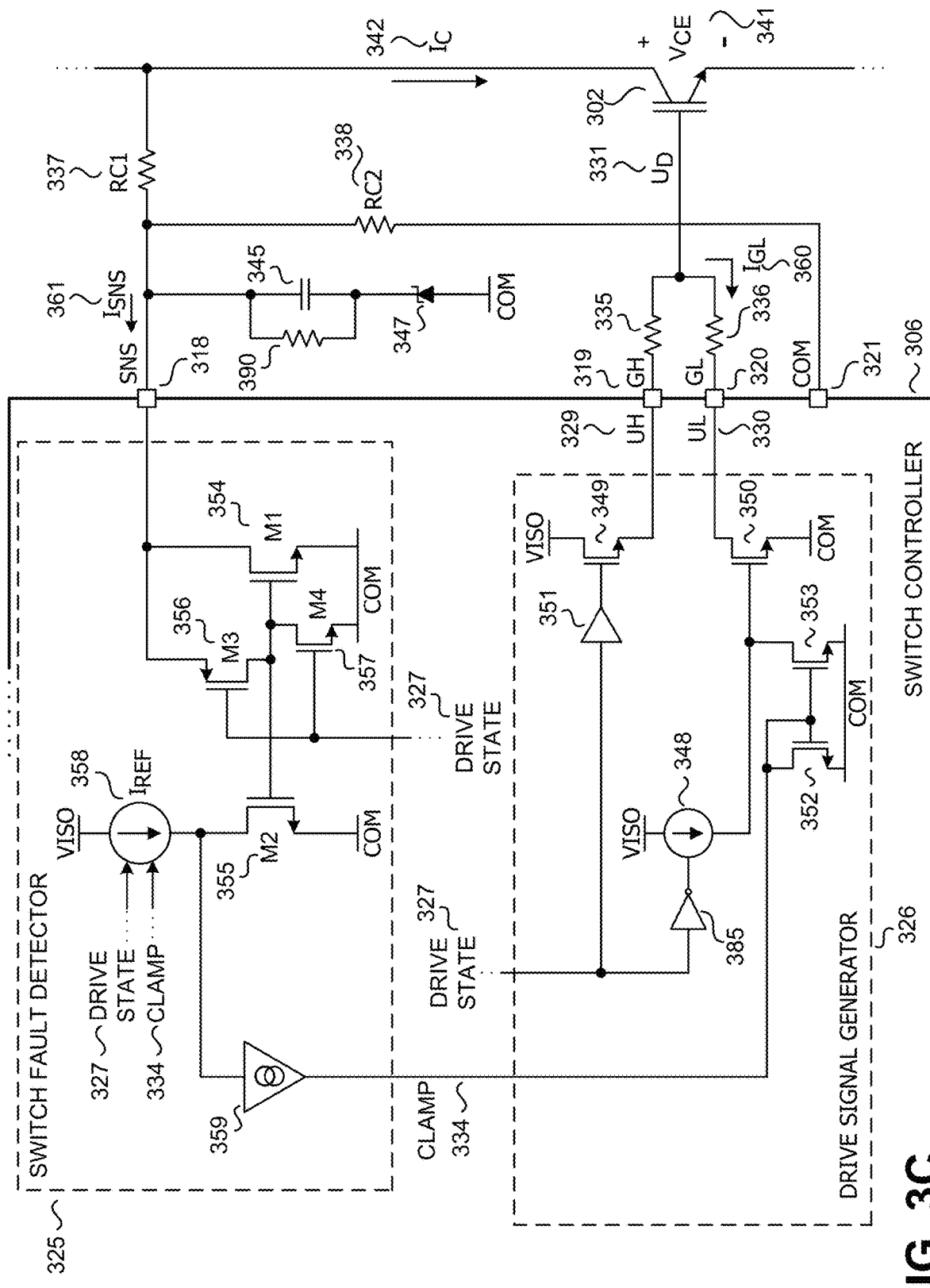
FIG. 3C illustrates an example switch fault detector for detecting overvoltage conditions and a blanking circuit of the switch controller of FIG. 1, in accordance with an embodiment of the present disclosure.

In FIG. 3C, switch fault detector 325 and drive signal generator 326 are coupled and function as described above in reference to FIG. 3A. However, FIG. 3C illustrates additional circuitry coupled to the sense terminal SNS 318. As shown, a resistance 390 and a capacitance 345 are coupled together in parallel and in series with a Zener diode 347. These components are coupled between sense terminal SNS 318 and return COM. As shown, the parallel-coupled resistance 390 and capacitance 345 are coupled to the cathode of Zener diode 347 whereas the anode of the Zener diode 347 is coupled to return COM.

In operation, Zener diode 347 disconnects capacitance 345 and resistance 390 from the SNS terminal 318 when the voltage VSNS at the SNS terminal 318 is less than the Zener voltage of Zener diode 347. Capacitance 345 slows the rate of increase of voltage VSNS at the sense terminal SNS 318, whereas resistance 390 discharges capacitance 345. During the transition between turn on and turn off of the power switch 302, there is some delay to the effective turn off transition due to the discharging of sense terminal SNS 318. Further, Zener diode 347 disconnects capacitance 345 and resistance 390 when the drive state signal 327 indicates that the power switch 302 should be off (i.e., drive state signal 327 is logic low) and switch fault detector 325 is to sense overvoltage conditions. As will be further discussed, during the turn on transition, switch fault detector 325 senses overcurrent and short-circuit conditions using sense voltage VSNS at sense terminal SNS 318). Switch fault detector 325 includes a blanking circuit that prevents switch fault detector 325 from responding to false faults within a blanking time. Capacitance 345 slows down the rate of increase of voltage VSNS at the SNS terminal 318 and effectively acts as an externally-set blanking time for switch fault detector 325. Please note that switch fault detector 325 may also include an internal blanking time. In some case, the internal blanking time of switch fault detector 325 may be set to a minimal level to operation with fast-switching power switches 302. For example, the internal blanking time of switch fault detector 325 may be set to 500 ns in view of SOA standards for SiC power switches 302. However, such a relatively short blanking time may be too short for other power switches 302, such as, e.g., IGBTs. For example, an IGBT power switch 30 may require about 1-1.5 us before switch voltage VCE 341 begins to decrease. A blanking time that is too short (e.g., 500 ns) may trigger a false fault. Capacitance 345 slows down the rate of increase of voltage VSNS at SNS terminal 318 and increases the effective blanking time.

Figure 4A:
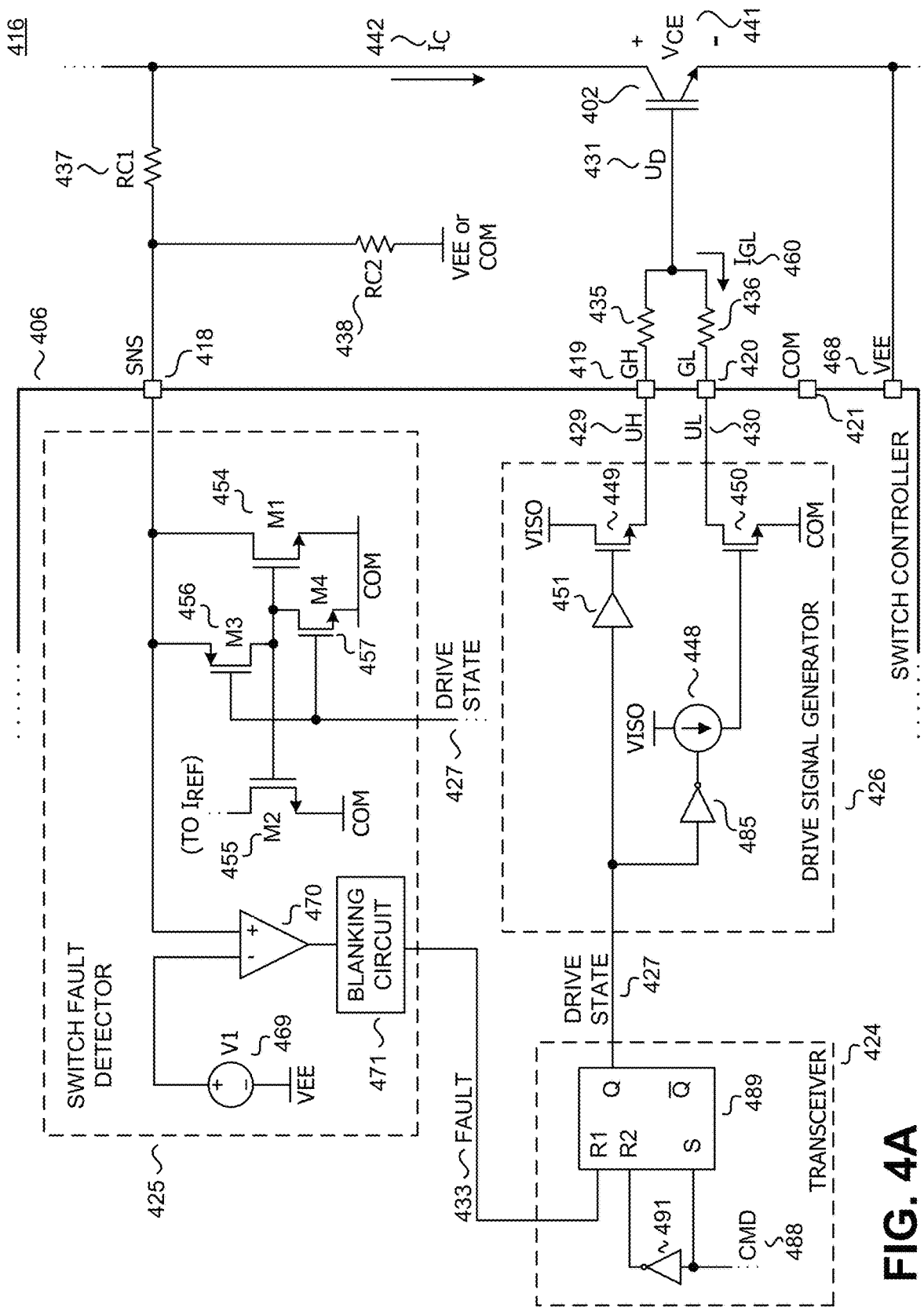
FIG. 4A illustrates an example switch fault detector for detecting overcurrent or short circuit conditions of the switch controller of FIG. 1, in accordance with an embodiment of the present disclosure.

FIG. 4A illustrates an example of circuitry within switch fault detector 425 for detecting overcurrent or short circuit conditions of the switch controller 402. The circuitry for detecting overcurrent or short circuit conditions in FIG. 4A can be combined with circuitry for detecting overcurrent and short circuit conditions as shown, e.g., in FIGS. 3A, 3C.

The circuitry within switch controller 406 includes a transceiver 424, a drive signal generator 426, and a switch fault detector 425. In the illustrated example, transceiver 424 includes a latch 489 and an inverter 491. Latch 489 includes two reset inputs R1 and R2. Inverter 291 is coupled between the set input and the second reset input R2. Transceiver 424 is coupled to receive a command signal CMD 488 to turn on or turn off the power switch 402. Command signal CMD 488 may be received from the driver interface and represents a command from the system controller. In one example, the command may be a rectangular pulse waveform with logic high and logic low sections of variable duration. Transceiver 424 generates drive state signal 427 based on command signal CMD 488. As shown, latch 489 receives command signal CMD 488 at its set input and receives an inverted version of the command signal CMD 488 at its second reset input R2. A leading edge in the command signal CMD 488 may indicate that power switch 402 is to be turned on. A trailing edge may indicate that power switch 402 is to be turned off. In operation, latch 489 outputs a logic high value (i.e., drive state signal 427 is logic high) at the leading edge of the command signal CMD 488 and outputs a logic low value (i.e., drive state signal 427 is logic low) at the trailing edge of the command signal CMD 488. Other implementations may of course use other forms of command signal CMD 488 and/or drive state signal 427 may be generated using other circuitry.

Transceiver 424 is also coupled to receive a fault signal 433 from switch fault detector 425. As shown, fault signal 433 is received at the first reset input R1 of the latch 489. As discussed further below, switch fault detector 425 asserts the fault signal 433 in response to a sensed overcurrent or short circuit condition. In response to fault signal 433 being asserted, latch 489 resets and drive state signal 427 transitions to logic low.

Drive signal generator 426 includes an on switch 449 and an off switch 450. Both on switch 449 and off switch 450 are shown as n-type transistors. One end of on switch 449 is coupled to source voltage VISO whereas the other end is coupled to gate high terminal GH 419. On switch 449 is controlled by drive state signal 427 via driver 451. In operation, when drive state signal 427 indicates that power switch 402 is to be turned ON (i.e., drive state signal 427 is logic high), driver 451 controls on switch 449 to turn ON and provides a gate high signal UH 429 to the gate high terminal GH 419 and resistance 435. Off switch 450 is also controlled off. Drive signal 431 is substantially the same as gate high signal UH 429 and power switch 402 is turned ON.

Off switch 450 is coupled between the gate low terminal GL 420 and return COM. Off switch 450 is controlled by drive state signal 427 via inverter 485 and current source 448. Inverter 485 receives drive state signal 427 and controls current source 448. As shown, current source 448 is coupled to control off switch 450. In operation, when the drive state signal 427 indicates that power switch 402 is to be turned OFF (i.e., drive state signal 427 is logic low), inverter 485 controls the current source 448 to provide enough current to turn on off switch 450. Off switch 450 couples gate low terminal 420 to return COM and a gate low signal UL 430 flows through off switch 450 and resistance 436. On switch 449 is OFF and power switch 402 is turned OFF. The current into the gate low terminal 420 may be referred to as the gate low current IGL 460.

The illustrated implementation of switch fault detector 425 includes transistors M1 454, M2 455, M3 456, and M4 457, a voltage source 469 that outputs a voltage V1, a comparator 470, and a blanking circuit 471. Transistors M1 454, M2 455, M3 456, and M4 457 are identical to transistors M1 354, M2 355, M3 356, and M4 357 (FIG. 3A, 3C) and coupled together to form a current mirror that can be switched on or off depending on the state of drive state signal 427. Comparator 470 includes an inverting input and a non-inverting input. The inverting input is coupled to receive voltage V1 output by voltage source 469. The non-inverting is coupled to sense terminal SNS 418 and receives voltage VSNS 418. The output of comparator 470 is coupled to blanking circuit 471. As discussed further below, blanking circuit 471 is coupled to blanks the output of comparator 470 for an internal blanking time after the power switch 402 turns ON. The illustrated switch fault detector 425 shown is to sense overcurrent and/or short circuit conditions. In response to detection of an overcurrent or short circuit condition, switch fault detector 425, transceiver 424, and drive signal generator 426 turn OFF power switch 402. Switch fault detector 425 receives the sense signal at the sense terminal SNS 418. For overcurrent and/or short circuit detection, the switch current IC 442 is read as a voltage signal, i.e., sense voltage VSNS 418. Resistance RC1 437 is coupled between sense terminal SNS 418 and the collector/drain of the power switch 402. Resistance RC2 438 is coupled to sense terminal SNS 418 and either return COM or emitter/source voltage VEE. Resistances RC1 437 and RC2 438 form a voltage divider that provides a voltage at sense terminal VSNS 418. Although only a single resistor is shown for RC1 437 and RC2 438, it should be appreciated that multiple resistors can be used.

In operation, switch fault detector 425 receives drive state signal 427 at the gates of transistors M3 456 and M4 457. In operation, the state of the drive state signal 427 indicates whether the switch fault detector 425 is to detect an overvoltage or an overcurrent/short circuit condition.

When drive state signal 427 indicates that the power switch 402 is to be ON (i.e., when drive state signal 427 is logic high), switch fault detector 425 is coupled to sense overcurrent and/or short circuit conditions using voltage VSNS at sense terminal SNS 418. With drive state signal 427 being logic high, transistor M3 456 is OFF and transistor M4 457 is ON. Transistors M1 454 and M2 455 do not operate as a current mirror. Since transistors M1 454 and M2 455 do not operate as a current mirror, the impedance seen at sense terminal SNS 418 is the input impedance of comparator 470 and the input impedance of sense terminal SNS 418 is thus high. Comparator 470 receives voltage SNS at the sense terminal SNS 418 and compares the sense voltage VSNS to the sum of voltage V1 and VEE. If sense voltage VSNS exceeds the sum of voltage V1 and VEE, then comparator 470 outputs an indication of a fault. The output of comparator 470 is received by blanking circuit 471. Blanking circuit 417 blanks the output of comparator 470 for an internal blanking time after the power switch 402 turns ON. After the internal blanking time has passed, the output of blanking circuit 471 includes any indication of a fault and in designated in the illustrated implementation as fault signal 433. Thus, fault signal 433 is asserted when the sense voltage VSNS is greater than the sum of voltage V1 469 and VEE 468 after the internal blanking time has passed. The asserted fault signal 433 resets latch 489 and drive state signal 427 transitions to a logic low value to turn off on switch 449 and turn on off switch 450. In response, power switch 402 is turned off.

The values of resistances RC1 437 and RC2 438 are determined in part by the internal voltage reference V1 of voltage source 469 and the desired desaturation level of the power switch 402. Further, sense terminal SNS 418 has a high input impedance which is in parallel with resistance RC2 438. In the illustrated example of FIG. 4A, the value of resistance RC2 438 can be selected to adjust the desaturation level relative to the internal reference V1 of voltage source 469. The greater the value of resistance RC2 438, the lower the desaturation level and the lower the value of the switch current IC 442 that triggers switch fault detector 425 to sense a fault.

Figure 4B:
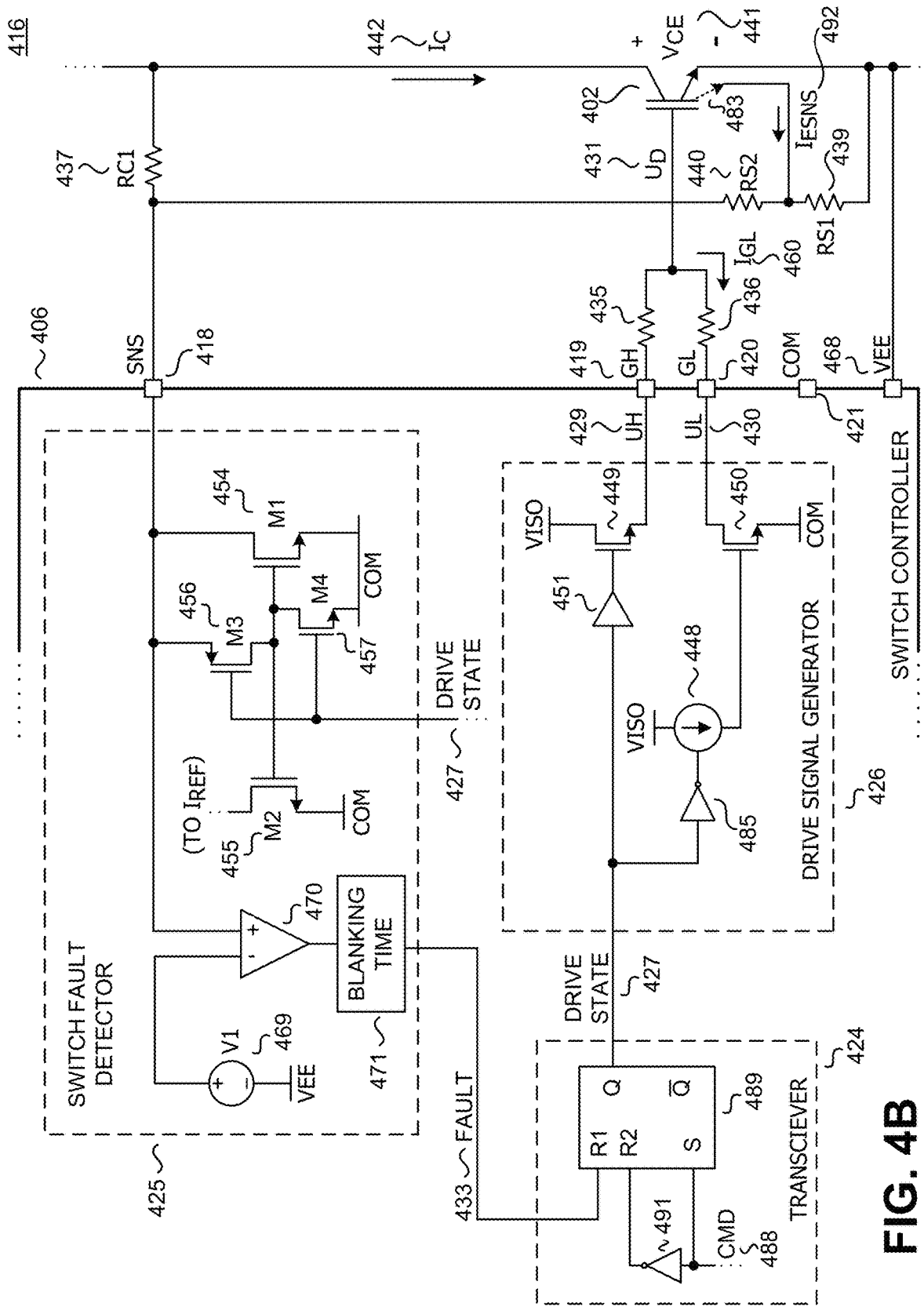
FIG. 4B illustrates another example switch fault detector for detecting overcurrent or short circuit conditions of the switch controller of FIG. 1, in accordance with an embodiment of the present disclosure.

In FIG. 4B, switch fault detector 425, transceiver 424, and drive signal generator 426 are substantially the same as shown in FIG. 4A. However, FIG. 4B includes a power switch 402 that includes a sense terminal 483 (shown in dashed lines). Sense terminal 483 is a tap terminal of, e.g., an IGBT power switch 402 and outputs a current that is a small percentage of current ICE that flows through power switch 402. Further, resistances RS1 439 and RS2 440 are coupled to sense terminal 483 to provide a sense signal. In addition, resistance RC2 438 has been removed.

Sense terminal 482 of power switch 402 outputs a current IESNS 492. Current IESNS 492 is a small percentage of switch current IC 442. Resistances RS1 439 and RS2 440 are coupled together as a voltage divider to provide a sense voltage VSNS to the sense terminal SNS 418. Sense voltage VSNS represents current IESNS 492. As shown, resistance RS1 439 is coupled to the sense terminal 483 and the emitter/source of the power switch 402. Resistance RS2 440 is coupled to the sense terminal 483 of the power switch 402 and the sense terminal SNS 418 of switch controller 406. The voltage across resistance RS1 139 is proportional to the total switch current IC 142. Resistance RS2 is used to couple the voltage across RS1 to the sense terminal SNS 118.

As with RC1, RS1, and RS2 in FIG. 4A, resistance RS2 adjusts the desaturation level relative to the internal reference voltage V1. Resistance RS2 couples a low voltage across RS1 to the sense terminal SNS 418. The value of RS1 is generally less than 50 ohms, e.g., usually around 10-20 ohms. Resistance RS2 is approximately 100 kOhms. Resistance RS2 440 adjusts the desaturation level for the power switch 402 relative to the internal reference voltage V1 of current source. The greater the value of resistance RS2 440, the lower the desaturation level that triggers sensing of a fault by the switch fault detector 425. Resistance RS1 439 converts current IESNS 492 into a voltage above the voltage range of the SOA of power switch 402. In one example, the voltage range of power switch 402 may be from 0.2V to 0.6V for SOA compliance.

Figures 4B, 4C:
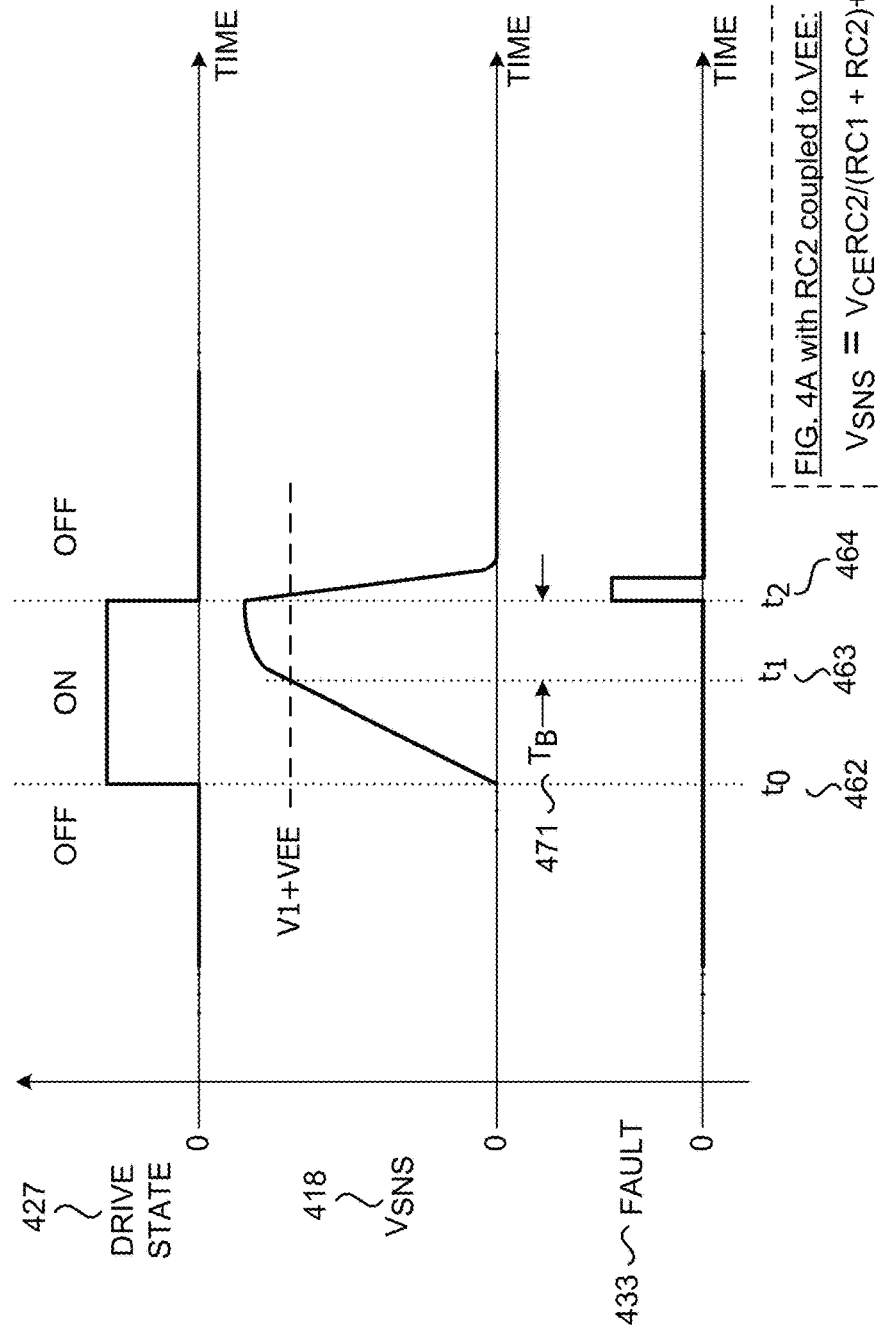
FIG. 4C illustrates a timing diagram of example waveforms of the various signals of FIGS. 4A and 4B, in accordance with an embodiment of the present disclosure.

FIG. 4C is a timing diagram 401 that illustrates various waveforms that can arise when power switch 402 is turning on and should be ON. In particular, waveforms of drive state signal 427, sense voltage VSNS 418, and fault signal 433 are shown. At time $t_0$ 462, drive state signal 427 transitions from logic low (indicating that power switch 402 is to be OFF) to logic high (indicating that power switch 402 is to be ON). Sense voltage VSNS 418—which represents switch current IC 442— also increases. Between time $t_0$ 462 and time $t_1$ 463, sense voltage VSNS 418 remains below the sum of voltage V1 and emitter voltage VEE. Fault signal 433 remains logic low (unasserted).

At time $t_1$ 463, sense voltage VSNS 418 reaches the threshold set by than the sum of voltage V1 and emitter voltage VEE. However, fault signal 433 remains logic low (unasserted) due to the internal blanking time $T_B$ set by the blanking circuit 471. At time $t_2$ 464, sense voltage VSNS 418 remains greater than the threshold set by than the sum of voltage V1 and emitter voltage VEE and blanking time $T_B$ 471 has passed. Fault signal 433 is asserted and transitions to a logic high value. In response, drive state signal 427 transitions to a logic low value and the power switch 402 is turned off. Switch current IC 442 decreases and the sense voltage VSNS 418 decreases. In one example, the threshold set by voltage V1 and emitter voltage VEE may be between 200 mV to 500 mV. The threshold may be selected to allow both Sense-IGBTs and MOSFETs to be monitored.

The dashed box shown in FIG. 4C illustrates the sense voltage VSNS 418 for FIGS. 4A and 4B.

For FIG. 4A with resistance RC2 438 coupled to emitter VEE 464, the sense voltage VSNS 418 is substantially:

$$V_{SNS} = \frac{V_{CE}RC2}{RC1 + RC2} + V_{EE}$$

For FIG. 4A with resistance RC2 438 coupled to return COM 421, the sense voltage VSNS 418 is substantially:

$$V_{SNS} = \frac{(V_C - COM)RC2}{RC1 + RC2} + V_{EE}$$

For FIG. 4B, the sense voltage VSNS 418 is substantially:

$$V_{SNS} = \frac{V_{CE}(RS1 + RS2)}{RC1 + RS1 + RS2} + V_{EE} + RS1/_{ESNS}$$

$$I_{ESNS} = \alpha I_{CE}; \alpha < 10000$$

Figure 4D:
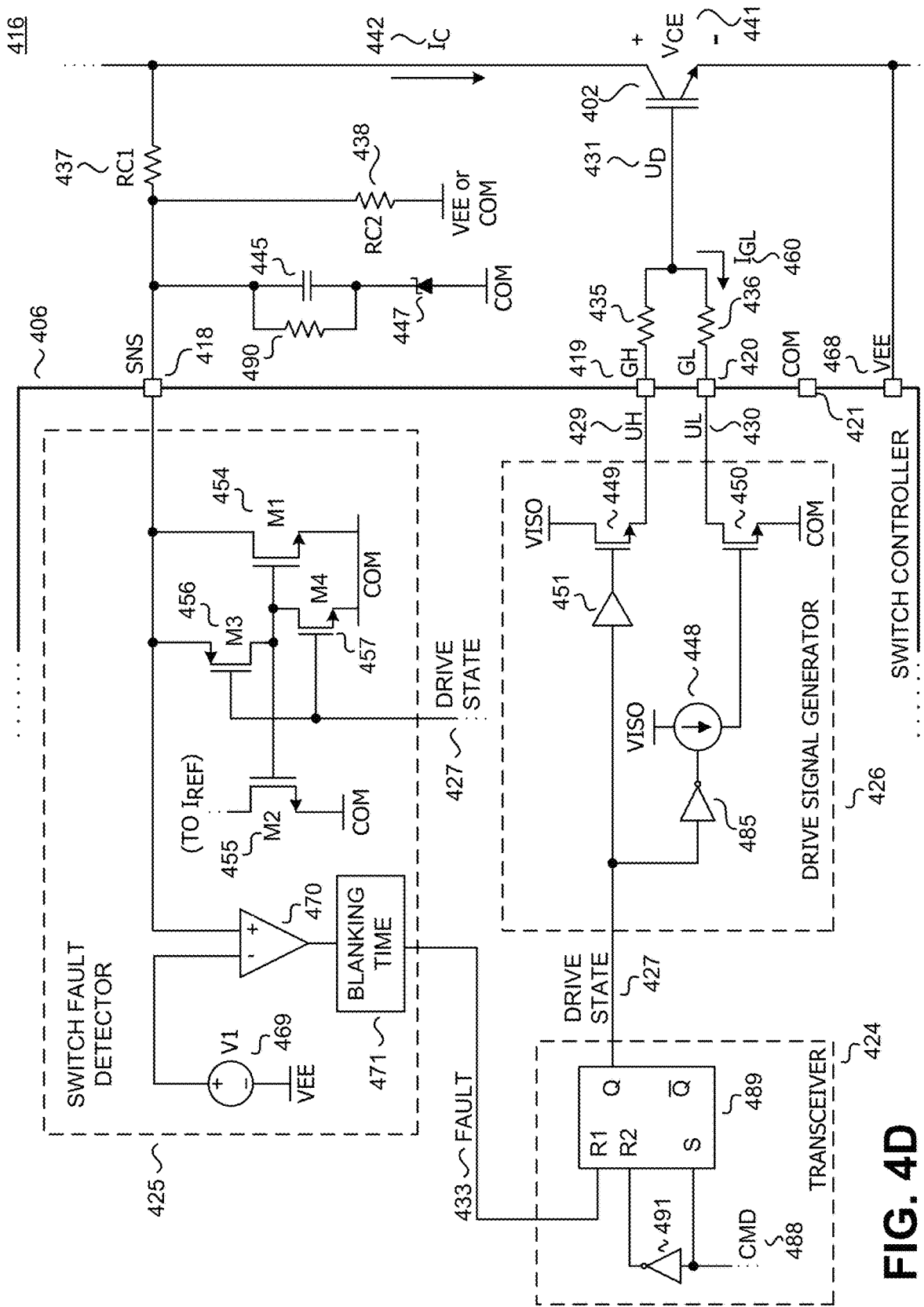
FIG. 4D illustrates another example switch fault detector for detecting overcurrent or short circuit conditions of the switch controller of FIG. 1 along with a discharge circuit, in accordance with an embodiment of the present disclosure.

In FIG. 4D switch fault detector 425, transceiver 424 and drive signal generator 426 are substantially the same as shown in FIGS. 4A, 4B. However, FIG. 4D includes additional circuitry coupled to the sense terminal SNS 418. As shown, resistance 490 and capacitance 445 are coupled together in parallel. The parallel-coupled resistance 490 and capacitance 445 are coupled in series with the Zener diode 447. These component are coupled between sense terminal SNS 418 and the cathode of a Zener diode 447. The anode of Zener diode 447 is coupled to return COM.

In operation, Zener diode 447 disconnects capacitance 445 from the SNS terminal 418 in response to voltage VSNS at the SNS terminal 418 falling below the Zener voltage of Zener diode 447. Capacitance 445 slows down the increase of the voltage VSNS at the sense terminal SNS 418. Resistance 490 discharges capacitance 445. During the transition between ON and OFF states of power switch 402, there is some delay due to discharging sense terminal SNS 418. Further, Zener diode 447 disconnects capacitance 445 and resistance 490 when drive state signal 427 indicates that the power switch 402 is to be off (i.e., when drive state signal 427 is logic low).

During turn on, switch fault detector 425 senses overcurrent and short circuit conditions using sense voltage VSNS 418. Blanking circuit 471 prevents switch fault detector 425 from responding to false faults within an internal blanking time TB. Capacitance 450 slows down rate of increase of sense voltage VSNS 418. As such, the effective blanking time of the switch fault detector 425 can be increased using external circuitry. For example, the internal blanking time TB of the switch fault detector 425 may be set to 500 ns to comply with SOA standards for a SiC power switch 402. However, this blanking time of 500 ns may be too short for IGBT power switches 402. For example, an IGBT power switch 402 may require 1-1.5 us before switch voltage VCE 441 begins to decrease. An effective blanking time of 500 ns may be too short a trigger a false fault. Capacitance 445 slows the rate of increase of voltage VSNS 418 and increases the effective blanking time of switch fault detector 425.

Figure 5:
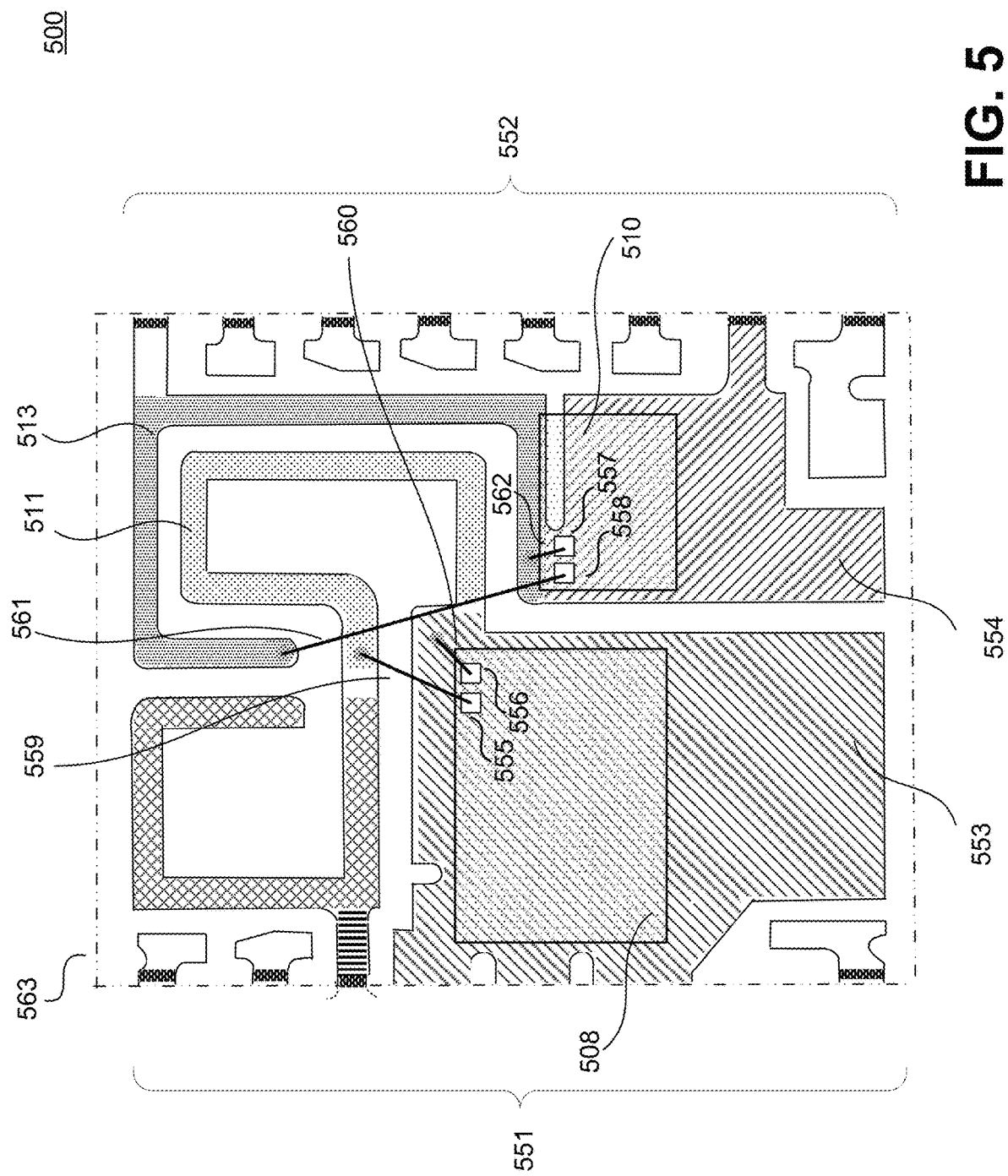
FIG. 5 illustrates an example lead frame of an integrated circuit package illustrating an example inductive coupling between dies, in accordance with an embodiment of the present disclosure.

FIG. 5 illustrates an example inductive coupling between a transmitter 508 and a receiver 510 within an integrated circuit package. The driver interface may be one example of the transmitter and the drive circuit may be one example of the receiver. The inductive coupling shown in FIG. 5 may be one example of the communication link 114 discussed above (FIG. 1).

In FIG. 5, the inductive coupling includes a transmit loop 511 and a receiver loop 513 that are defined in the lead frame 500 of the integrated circuit package. Lead frame 500 is disposed substantially within an encapsulated portion 563 of an integrated circuit package. In the illustrated implementation, the lead frame 500 includes a first conductor including the transmit loop 511 and a second conductor including the receiver loop 513. The second conductor of the lead frame is galvanically isolated from the first conductor. Transmitter conductive loop 511 is disposed proximate to the receiver conductive loop 513 to provide a magnetically coupled communication link between the transmitter conductive loop 511 and the receiver conductive loop 513. In addition, leads 551 and 552 are coupled to a respective die attach pad 553 and die attach pad 554. Elements within the encapsulation 563 are disposed within the encapsulated portion of the integrated circuit package. Further shown in FIG. 5 are transmitter 508, receiver 510, pads 555, 556, 558, and 557, and bond wires 559, 560, 561, and 562.

In one example, transmitter 508 and receiver 510 are implemented as circuits in integrated circuit dice included within the encapsulated portion of the integrated circuit package. Die attach pad 553, which is part of the first conductor of lead frame 560, is denoted by diagonal cross-hatching in FIG. 5 and denotes the portion of the lead frame 500 onto which transmitter 508 is mounted. Similarly, die attach pad 554, which is part of the second conductor of lead frame 500, is shaded with diagonal cross-hatching in FIG. 5 and denotes the portion of the lead frame 500 onto which the receiver 510 is mounted. In one example, the transmitter 508 and receiver 510 are attached to the respective isolated first and second conductors of the lead frame 500 utilizing an adhesive. The adhesive may be non-conductive. In another example, the adhesive may be conductive.

Leads 551 and 552 denote portions of the lead frame 500 which may couple to circuits that are external to the integrated circuit package (in other words, outside of profile 563). Although not shown, various bond wires may couple either the transmitter 508 or the receiver 510 to any of the leads 551 or 552.

The portion of lead frame 500 shaded by loosely packed dots in FIG. 5 corresponds to the transmitter conductive loop 511. The portion of lead frame 500 and bond wires 559 and 560 complete the transmitter conductive loop 511. Bond wire 559 and 560 are attached to the portion of lead frame 500 corresponding to the transmitter conductive loop 511 using wire bonding techniques. Further, the bond wire 559 is coupled to transmitter 508 through pad 555 whereas bondwire 560 is coupled to the transmitter 508 through pad 556.

The portion of the lead frame 500 shaded by densely packed dots in FIG. 5 corresponds to the receiver conductive loop 513. Bond wires 561 and 562 are attached to the portion of lead frame 500 corresponding to the receiver conduction loop 513 using wire bonding techniques. Bond wires 561 and 562 couple the portion of the lead frame 500 corresponding to the receiver conduction loop 513 to the receiver 510 via pads 558 and 557, respectively. By utilizing galvanically isolated magnetically coupled conductive loops of the lead frame to provide a communications link between the transmitter and, very little cost is added. In addition, utilizing the lead frame may also reduce the overall size of the switch controller and the cost of the package.

As mentioned above, the driver interface may be one example of transmitter 508 while the drive circuit may be one example of the receiver 510. The driver interface may send communications to the drive circuit, such as a command signal to turn ON or OFF the power switch, which is transmitted by the inner loop 511 (transmit loop 511) and received by the outer loop 513 (receiver loop 513). The drive circuit can send communications to the driver interface, such as a fault signal, which is transmitted by the outer lop 513 (receiver loop 513) and received by the inner loop 511 (transmit loop 511). As such, the inductive coupling shown in FIG. 5 may also be an example of bidirectional communication.

Figure 6:
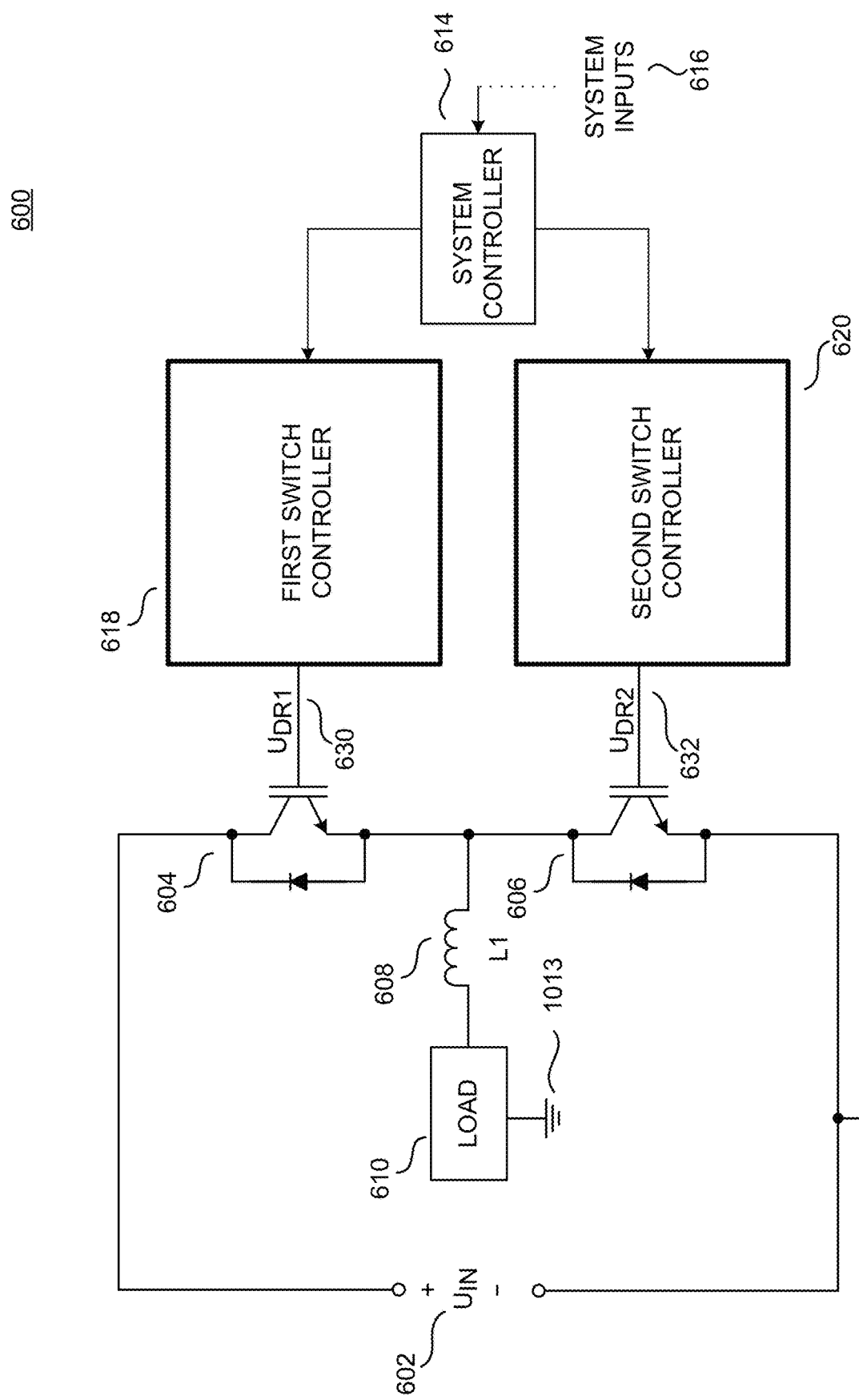
FIG. 6 illustrates an example power converter utilizing a switch controller with a switch fault detector, in accordance with an embodiment of the present disclosure.

FIG. 6 illustrates an example power converter 600 that includes switch controllers in accordance with examples of the present invention. Power converter 600 provides electrical energy to a load 610. Power converter 600 includes two power switches 6 and 606 coupled in series. In addition, power converter 600 receives an input voltage 602 ($U_{IN}$). Power converter 600 is designed to transfer electrical energy from the input to a load 610 by controlling the switching of power switches 604 and 606. In different implementations, the power converter 600 can control voltage, current, or power levels of the energy output to the load.

In the example shown in FIG. 6, the power switches 604 and 606 are n-channel IGBTs. However, examples of the present invention can also be used in combination with other power switches. For example, metal-oxide-semiconductor field-effect transistors (MOSFETs), bipolar transistors, injection enhancement gate transistors (IEGTs) and gate turn-off thyristors (GTOs) can be used. In addition, the power converter 600 can be used with power switches which are based on gallium nitride (GaN) semiconductors or silicon carbide (SiC) semiconductors.

Power switches 604 and 606 are each controlled by a first and second switch controllers 618, 620. The first switch controller 618 and the second switch controller 620 may include the switch controller described above. The first switch controller 618 and the second switch controller 620 provide a first and second gate driver signal 630 and 632 ($U_{DR1}$, $U_{DR2}$) which control the switching of the first and second IGBTs 604 and 606. The two control circuits 618 and 620 can optionally be controlled by a system controller 614. Such a system controller can include an input for receiving system input signals 616. In the example shown in FIG. 6, two power semiconductor switches with a half-bridge configuration are illustrated. However, other topologies can also be used.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

The invention claimed is:

1. A method of driving a power switch comprising:
providing a drive signal to a control input of the power switch;
coupling a sense terminal to a main terminal of the power switch;
mirroring a current input into the sense terminal during turn-off by using a current mirror;
determining a highest voltage of the main terminal during turn-off by comparing a current signal from the current mirror to a first current threshold; and
determining a highest voltage of the main terminal during turn-on by comparing a signal from the sense terminal to a turn-on threshold.

2. The method of claim 1, wherein determining the highest voltage of the main terminal during turn-off by comparing the current signal from the current mirror to the first current threshold comprises:
reducing a rate of turn-off when a voltage of the main terminal exceeds the first current threshold.

3. The method of claim 1, wherein determining the highest voltage of the main terminal during turn-on by comparing the signal from the sense terminal to the turn-on threshold comprises:
timing a duration during which the sense terminal exceeds the turn-on threshold.

4. The method of claim 1, wherein mirroring the current input into the sense terminal during turn-off comprises:
coupling a current mirror to the sense terminal during turn-off and in an OFF state.

5. The method of claim 4, further comprising:
decoupling the current mirror from the sense terminal during turn-on and in an ON state.

6. The method of claim 5, further comprising:
receiving a drive state signal indicative of whether the power switch is in the OFF state or in the ON state.

7. Driver circuitry for driving a power semiconductor switch the driver circuitry comprising:
a control terminal driver circuitry coupled to a control input of the power semiconductor switch and configured to provide a drive signal thereto;
a sense terminal coupled to a main terminal of the power semiconductor switch;
a first current comparator coupled to compare, during turn-off, a signal received from the sense terminal to a variable turn-off threshold and, in response, to provide a first signal, wherein the variable turn-off threshold represents a highest voltage of the main terminal during turn-off; and
a second comparator coupled to compare, during turn-on, a signal received from the sense terminal to a turn-on threshold and, in response, to provide a second signal, wherein the turn-on threshold represents a highest voltage of the main terminal during turn-on.

8. The driver circuitry of claim 7, wherein the driver circuitry further comprises a current mirror coupled between the sense terminal and the first current comparator.

9. The driver circuitry of claim 7, further comprising timer circuitry configured to time a duration during which the second signal indicates that the signal received from the sense terminal exceeds the turn-on threshold during turn-on.

10. The driver circuitry of claim 7, wherein an input impedance of the sense terminal is lower during turn-off than during turn-on, wherein the input impedance of the sense terminal is less than 200 kOhms during turn-off and greater than 10 MOhms during turn-on, wherein the input impedance of the sense terminal is less than 10 kOhms during turn-off and greater than 100 MOhms during turn-on.

11. The driver circuitry of claim 7, wherein the variable turn-off threshold also represents the highest voltage of the main terminal in an OFF state; and the turn-on threshold also represents the highest voltage of the main terminal in an ON state.

12. The driver circuitry of claim 7, further comprising switching circuitry configured to couple the first current comparator to the sense terminal during turn-off and in an OFF state and decouple the first current comparator from the sense terminal during turn-on and in an ON state.

13. The driver circuitry of claim 12, wherein the switching circuitry is coupled to receive a drive state signal indicative of whether the power semiconductor switch is in the OFF state or in the ON state.

14. The driver circuitry of claim 12, wherein the first current comparator, the second comparator, and the switching circuitry are in a single semiconductor package, wherein the sense terminal is a terminal of the single semiconductor package.

* * * * *